United States Patent [19]

Beall et al.

[11] 4,156,936
[45] May 29, 1979

[54] APPARATUS AND METHOD FOR IMPROVED OPERATION OF BUBBLE DEVICES

[75] Inventors: Gregory W. Beall, Cincinnati, Ohio; Mitchell S. Cohen, Ossining; Mark H. Kryder, Yorktown Heights, both of N.Y.

[73] Assignee: International Business Machines Corporation, Armonk, N.Y.

[21] Appl. No.: 801,872

[22] Filed: May 31, 1977

[51] Int. Cl.² .................................... G11C 19/08
[52] U.S. Cl. ................................ 365/16; 365/15
[58] Field of Search ............... 340/174 TF; 365/15, 365/16

[56] References Cited

U.S. PATENT DOCUMENTS

| 3,697,963 | 10/1972 | Kish et al. | 365/16 |
| 3,713,116 | 1/1973 | Bonyhard et al. | 365/16 |
| 3,714,639 | 1/1973 | Kish et al. | 365/16 |

FOREIGN PATENT DOCUMENTS 2360152  6/1977  France ........................... 365/15

OTHER PUBLICATIONS

IEEE Transactions on Magnetics, vol. MAG-9, No. 3, Sep. 1973, pp. 481-484.
IBM Technical Disclosure Bulletin, vol. 17, No. 3, Aug. 1974, p. 945.
IBM Technical Disclosure Bulletin, vol., 19, No. 7, Dec. 1976, pp. 2751-2752.

Primary Examiner—James W. Moffitt
Attorney, Agent, or Firm—Pollock, Vande Sande & Priddy

[57] ABSTRACT

SLM field access bubble devices which include at least one conductor crossing a bubble propagation path have severely limited operating margins (especially for small bubbles) for the bubble in the vicinity of the conductor. Apparatus and method for operating such a bubble device is disclosed which improves the device operation in this region. The improved apparatus and method provides an additional field source with a sense and magnitude to support the bubble when it reaches the conductor region. Such a field source, as disclosed, includes a current pulse in the conductor.

28 Claims, 6 Drawing Figures

APPARATUS AND METHOD FOR IMPROVED OPERATION OF BUBBLE DEVICES

FIELD OF THE INVENTION

The present invention relates to field access bubble devices, such as switches, in which a conductor crosses the bubble propagation path.

BACKGROUND OF THE INVENTION

The ability to create, support, propagate and detect single walled magnetic domains in particular types of material has been applied, in the prior art, to perform memory and logic functions, useful, for example, in digital computer type applications. The single walled magnetic domains, or more popularly "bubbles" (as they will be referred to herein) are actually regions of magnetization, in a particular type of material which is directly opposite to the magnetization direction of a major portion of the material. Regardless of the function to be performed, it is well known that such bubble devices include at least the following, a sheet of material which is capable of supporting bubbles under the proper conditions, adjacent such a sheet of material are provided some means for, at least, propagating the bubbles. The most popular arrangement of apparatus for propagating the bubbles is termed "field access" and includes properly shaped elements of a magnetic material which, when subjected to a reorienting drive magnetic field parallel to the plane of the sheet of material supporting the bubbles, produce a propagating series of potential wells which cause the bubble or bubbles in the sheet of material supporting the bubbles to propagate synchronously with the potential wells. A further bias field is also provided normal to the magnetic sheet of material and the interaction of the bias and drive fields provide for stable propagating bubbles along the paths defined by the magnetic elements. the reorienting magnetic field usually comprises a magnetic field rotating about an axis parallel to the bias field.

The prior art has disclosed a number of devices for the selective switching of the propagation path followed by a stream of bubbles. One class of such devices includes a conductor arranged to cross a bubble propagation path such that the presence or absence of current in the conductor determines which of the possible propagation paths a bubble will follow.

The fabrication of bubble devices has employed some of the same fabrication techniques employed for integrated circuits, namely, the selective deposition and/or etching of the material through masks of desired patterns. One particularly advantageous procedure is termed "single level masking" (hereinafter SLM) in which a single masking step defines at least the critical patterns of the device. Accordingly, the same critical patterns are composed of the same material. An example of a bubble transfer switch which can be fabricated employing SLM techniques is disclosed in the co-pending application of George S. Almasi, W. E. Bogholtz and G. E. Keefe, filed July 28, 1976, Ser. No. 709,358.

Of particular importance in the fabrication and operation of bubble devices is the tolerance those devices exhibit to changes in bias and drive field, and one figure of merit for these devices is the range of field amplitudes over which they will operate, sometimes called margins. It has been found that the margins of SLM bubble devices in which a conductor crosses a field access bubble propagation path is more limited than the operating margins for the field access bubble propagation path itself. More particularly, bubble collapse has been noted in the region of the conductor. It has been found particularly difficult to arrange bubble transfer devices which include a conductor crossing a field access propagation path fabricated using SLM technology to reliably operate with desirably small bubbles, although the reasons for the difficulty are not clearly understood.

This particular difficulty becomes pronounced when one desires to work with bubbles whose diameter is on the order of one micron or less.

In addition, bubble devices which are not necessarily fabricated with SLM techniques, are subject to bubble stripout or collapse. Bubble stripout can occur in a Y-bar bubble switch, for instance, between an element of the switch and either another element of the switch or an adjacent element. Bubble collapse is noted during bubble travel through the switch. Both problems are related to limited operating margins, the former relates to limited lower field margins and the latter to limited upper field margins.

It is therefore one object of the invention to provide a method and apparatus for increasing operating margins in field access bubble devices. It is another object of the invention to provide method and apparatus for increasing operating margins in bubble switches in which bubble travel traces out a Y. It is another object of the invention to provide in SLM field access bubble devices a method and apparatus to overcome the heretofore encountered difficulties in the vicinity of a conductor. It is another object of the invention to provide a method of operating such a device which allows increased operating margins especially in the region of the crossing of the conductor and the field access propagation path. It is still another object of the invention to provide an improved bubble transfer switch with increased operating margins at least in the region wherein a conductor crosses a field access bubble propagation path.

SUMMARY OF THE INVENTION

These and other objects of the invention are met by providing in a SLM bubble device, such as a switch including a conductor and a field access propagation path, a field source in addition to the bias and drive fields for supporting the bubbles in the vicinity of the conductor during the period when magnetization reversal is occurring in the conductor. One example of such field source which has been found to be particularly effective is a current pulse in the conductor properly timed relative to the orientation of the magnetic drive field. The effect of the current pulse can be viewed in either of two lights, the pulse provides a magnetic field which in turn creates a potential well for support of the bubble. Viewed in another light, the current pulse in the conductor provides for displacing the bubble away from the conductor which is a region of particular vulnerability for the bubble during the magnetization reversal process. Viewed in either light, the additional magnetic field source prevents bubble annihilation in a range of bias and drive field amplitudes, thereby increasing the operating margins of the device. The current pulse can be of either polarity although device geometry may require a higher amplitude for a pulse of one polarity.

The invention also provides for increased operating margins in field access bubble devices, regardless of device fabrication. More particularly, a field source in addition to the bias and drive fields, inhibits bubble stripout or collapse. Such a field can be provided by a current pulse in a device conductor, which conductor may carry a further current pulse to aid in device function. For example, in a bubble switch which includes a conductor which selectively is pulsed to determine the switch function, an additional pulse can be provided to inhibit bubble stripout or collapse.

The invention may then provide for a pulse sequence in such conductor in which a first current pulse inhibits the latter mentioned stripout or collapse. A second pulse may inhibit bubble collapse in the vicinity of the conductor. A third current pulse is selectively applied to aid in device functioning. While the first and third pulses are of the same polarity, the second pulse can be of either polarity. Device geometry may, however, dictate that one or another polarity pulse requires a higher amplitude.

BRIEF DESCRIPTION OF THE DRAWINGS

The present invention will now be described in more detail with reference to the accompanying drawings in which like reference characters identify identical apparatus and in which.

DETAILED DESCRIPTION OF PREFERRED EMBODIMENTS

Figure 1:
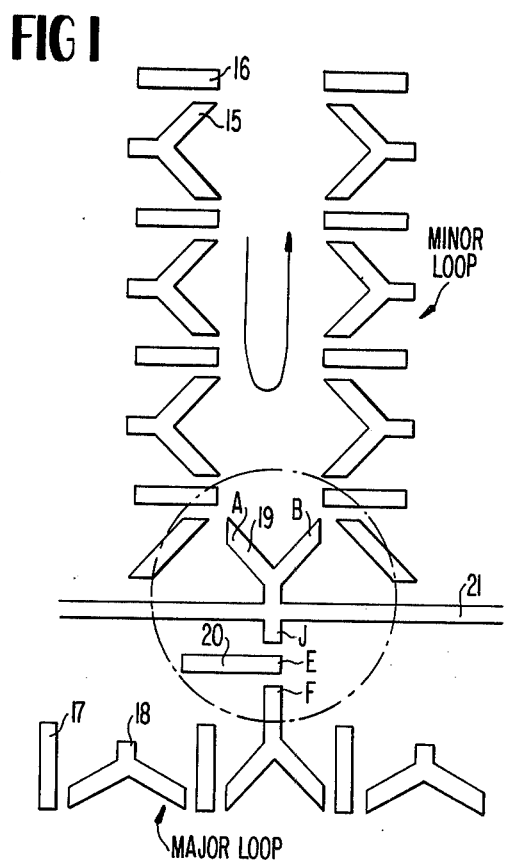

FIG. 1 is a top view of a bubble memory device, including an intersection of a minor loop with a major loop, in a well known major/minor loop memory organization, for example, as described in U.S. Pat. No. 3,618,054. The minor loop consists of a series of Y and I bar propagation elements 15 and 16. Likewise, the major loop consists of a series of Y bar and I bar elements 17 and 18. For purposes of this description, the propagation elements illustrated are merely exemplary of a wide variety of well known propagation elements which could be employed. Of particular interest is the bubble switch at the intersection consisting of a Y bar element 19 and an I bar element 20 and a conductor 21. This particular SLM switch is described in more detail in co-pending application Ser. No. 709,358, filed July 28, 1976, assigned to the assignee of this application the disclosure of which is incorporated by reference. As is disclosed in the referenced application, upon suitable application of a drive field, such as the one illustrated in FIG. 1, along with a well known bias field, bubbles will propagate in the minor loop and the major loop, and bubbles will be allowed to switch from the minor loop to the major loop depending on the presence or absence of current in the conductor 21. As is also disclosed in the referenced application, a similar transfer switch can be provided to allow a bubble or bubble stream to be switched from the major loop to the minor loop.

Figure 2:
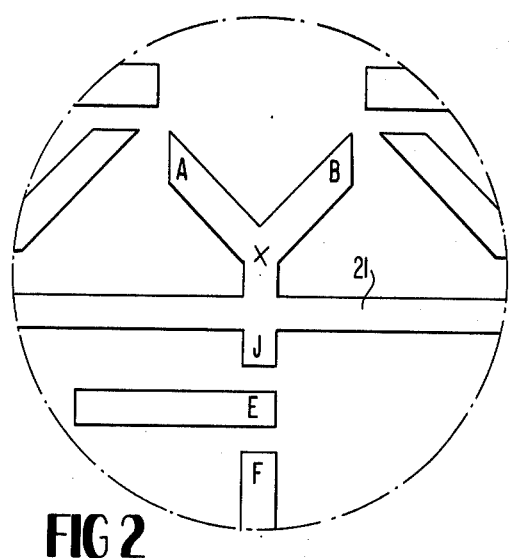
FIG. 1 is a top view of a major/minor loop intersection showing a conductor controlled switch and FIG. 2 is an enlarged view.

FIG. 2 is a blown-up view of the transfer switch illustrating the same components, and will be referred to hereinafter to explain the operation of the switch and the manner in which the present invention overcomes the problems referred to above.

In the following explanation, the different phase positions of the drive field will be referred to by the numerals identified in FIG. 1 associated with the drive field phase being discussed. With the drive field at phase 2, a bubble entering the transfer switch will be located on an arm of the Y at the position A. As the field reorients to phase 3, a bubble will be located in the vicinity of J. As the field reorients to the position 4, there is a potential ambiguity in the bubble position in that locations E and B are favorable. In the absence of current pulse in the conductor 21, the bubble will move to position E, and as the drive field reorients to phase 1, the bubble will move to position F. On the other hand, with a current pulse of proper polarity in the conductor, from phases 2-4, the bubble will take the path A-J-B. Thus, the presence or absence of a current in conductor 21 determines the path over which the bubble will travel.

Figure 3:
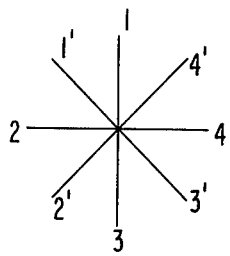
FIG. 3 is a plot of various current sequences and the related upper operating margins related thereto in the device of FIG. 1.
Figure 3:
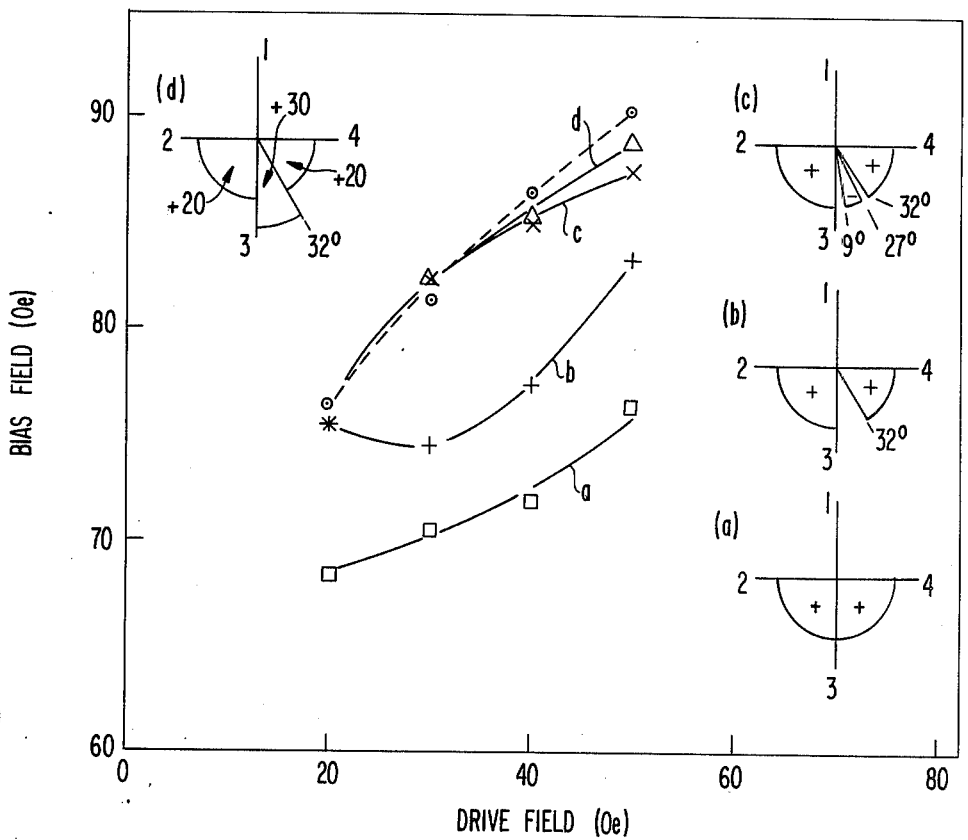

One of the goals of the invention is to increase the operating margins of bubble devices. As previously mentioned, switches of the type illustrated (SLM or otherwise) exhibit bubble collapse during the bubble's travel from A-J and further exhibit bubble stripout from A-B during the time the bubble is located at A. Further, it has been found that as the field associated with the device illustrated in FIGS. 1 and 2 is increased, a limit is reached where the bubbles tend to collapse in the vicinity of the location J. Bubble stripout is related to a limited lower operating margin and collapse is related to a limited upper operating margin, and thus it is a goal of the invention to increase the margins of bubble devices. The limited upper operating margins are particularly troublesome as the desired bubble diameter is reduced. For example, at one micron or less bubble diameter (with the conductor 21 of a two micron width) the limited upper operating margin is a severe handicap. FIG. 3 is a plot of four different upper margins for the switch illustrated in FIGS. 1 and 2; the four different plots are identified by the reference characters a, b, c and d, wherein the Figure also illustrates the current carried by the conductor 21. The switch used to derive the margin plots of FIG. 3 supported five micron bubbles in a garnet atop which was a 4500°A oxide layer, followed by a gold film of 3000°A. A NiFe film 3000°A in thickness was deposited on the gold film. As shown in FIG. 3, therefore, for the case (a) the current pulse lasted from phases 2-4 and remained unchanged in magnitude and polarity.

The exact mechanism which causes the bubbles to be collapsed at location J in the presence of fields above the margin curve (a) are not completely understood. It is believed, however, that the presence of the conductor 21 which contains a layer of permalloy as does the Y bar (due to the SLM fabrication) plays an important part in the bubble collapse. More particularly, in phase 2, the magnetization is to the left in the conductor. Because of the length of the conductor it has a high de-magnetizing field in direction 3 and thus as the drive field rotates between phases 2 and 3, the conductor magnetization undergoes little, if any, change. As the drive field passes phase 3 and begins approaching phase 4, the magnetization in the conductor 21 changes in sense, that is, at phase 4 the magnetization is directed to the right. During this magnetization reversal process, we have found that the permeability of the conductor 21 is drastically reduced and bubble collapse in the region J appears to be a direct result of that effect. To maintain bubble integrity, a localized magnetic field is required to overcome the time limited reduction in permeability caused by magnetization reversal. The permeability reduction of the conductor 21 during magnetization reversal is limited in time to the vicinity of phase 3 and in space to the region of the conductor. The space region of interest is further limited since bubbles will be confined to the vicinity of the propagation path. Accordingly, we have found that application of an additional localized magnetic field, limited in time, will overcome this difficulty. Preferably, this time limited localized additional magnetic field can be supplied by modifying the current carried by conductor 21 to be different than the current existing from phase 2-4 as shown in example (a), FIG. 3.

For example, the upper margin plot (b) is achieved for currents in the conductor 21 illustrated by the phase diagram (b). That is, more particularly, at phase 3, the current in conductor 21 is reduced to zero and is maintained at that level until the phase is advanced to $32/90^{ths}$ (or 32°) of the rotation between phases 3 and 4. It will be appreciated from the margin plot for (b) that the bubble is now supported at higher field levels than under the conditions of (a), i.e., the upper operating margin is increased.

A still further current sequence is illustrated in example (c) and the corresponding upper margin plot is also illustrated in FIG. 3. The particular current sequence employed in example (c) is to reduce the current in the conductor to zero for approximately 10% of the time between phases 3 and 4 (9°), then provide a current pulse of polarity opposite to the preceding pulse for about 20% of the time (18°), then reduce the current in the conductor to zero for about 5° and finally a current of polarity opposite to the intermediate pulse is provided until phase 4. Thus, the single positive pulse (from phase 2-4) of example (a) is now three pulses, of approximately equal amplitude with the intermediate pulse of opposite polarity.

Finally, example (d) illustrates that essentially the same upper margin can be achieved with an intermediate pulse which is larger in magnitude than the first and last pulses and of the same polarity. As shown in example (d) the amplitude of the intermediate pulse is 50% more than that of the other pulses.

Of the pulse sequences illustrated in FIG. 3, the positive pulse from phase 2 to 3 helps to prevent bubble collapse as the bubble traverses the region A-J. This pulse also serves to inhibit stripout from A-B. The effect of this pulse on bubble devices is not related to SLM devices and such a pulse, at the times shown in FIG. 3 is useful in bubble devices regardless of fabrication techniques. The last pulse in the sequence, i.e., the pulse ending at phase 4, is the switching pulse which is employed, in this example, to maintain the bubbles in the minor loop, that is, absence of the switching pulse, will cause the bubble to be expelled from the minor loop and to enter the major loop. The first two pulses, for example (c) and (d), can be employed whether or not the switching pulse is present and when the switching pulse is absent, the first two pulses will have the same effect as they do in the case with the switching pulse present, i.e., the first pulse inhibits bubble collapse in the region A-J, and the second pulse supports the bubble in region J.

The intermediate pulse, that is, the pulse that precedes the switching pulse in examples (c) and (d), can be viewed in either of two lights. It can be viewed as supplying a localized field necessary to support the bubble when, during the magnetization reversal process, the conductor 21 fails to provide such a field. Alternatively, the intermediate pulse can be viewed as displacing the bubble away from a vulnerable position, that is, away from the location J, so that the effect of magnetization reversal is reduced sufficiently to maintain the bubble integrity. Thus, the negative pulse of example C serves to displace the bubble toward the area at E and the positive pulse of example D would displace the bubble toward the position X.

Figure 4:
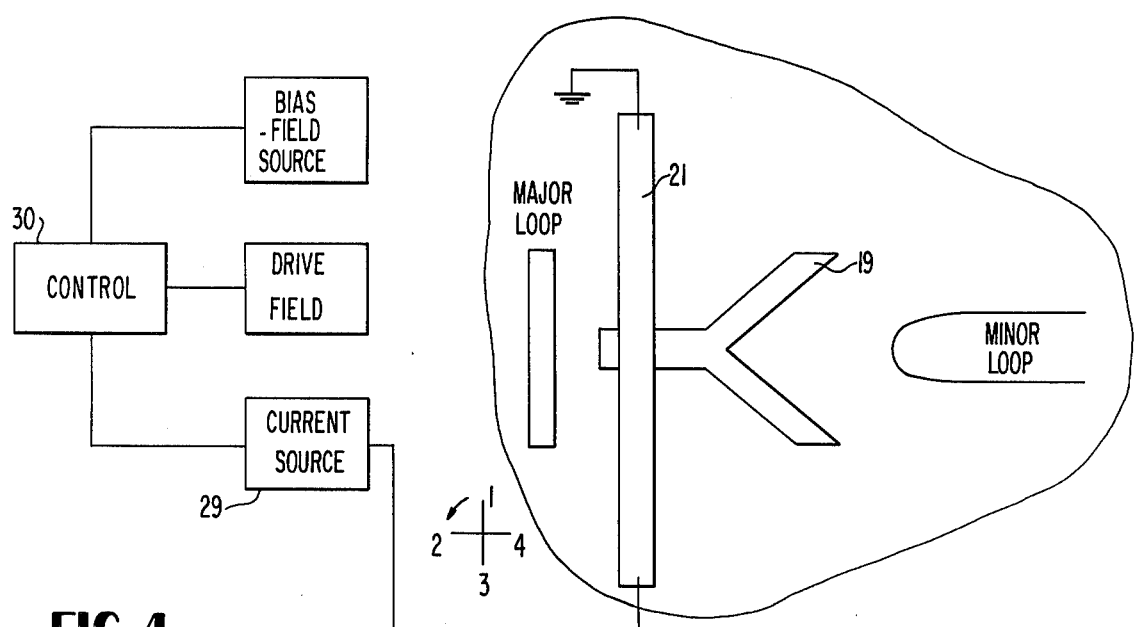
FIG. 4 is a block and schematic diagram of a switch operated in accordance with the method and apparatus of the invention.
Figure 4A:
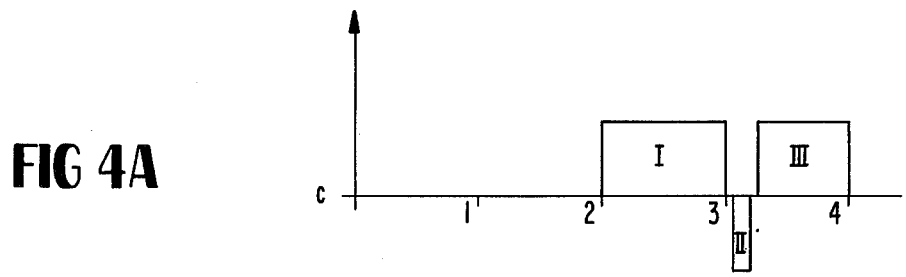
FIGS. 4A and 4B are plots of two suitable current sequences as a function of time for the apparatus of FIG. 4.

FIG. 4 illustrates apparatus to operate the bubble switching device in accordance with the principles and methods of the present invention. As shown in FIG. 4, the conductor 21 and Y bar switch 19 are illustrated coupling the minor loop and major loop, such as loops shown in FIG. 1. Also shown in FIG. 4 are bias and drive field sources, which themselves are well known to those skilled in the art. A control 30 is provided to operate the bias field source and drive field as well as to control the operation of a current source 29 coupled to the conductor 21. Although not illustrated, control 30 requires a data input for determining, for every cycle of the drive field, whether the bubble switch is to allow minor loop bubbles to be coupled into the major loop, or to prevent such coupling. FIG. 4A shows the current waveform in the conductor 21, corresponding to the example (c) of FIG. 3. More particularly, a current pulse I is provided from phase time 2 to 3 and with one polarity. A short pulse, of the same magnitude but opposite polarity, pulse II, is provided corresponding to the intermediate pulse shown in the phase diagram example (c). Finally, the switching pulse III is provided which is of the same polarity as the first pulse I.

Figure 4B:
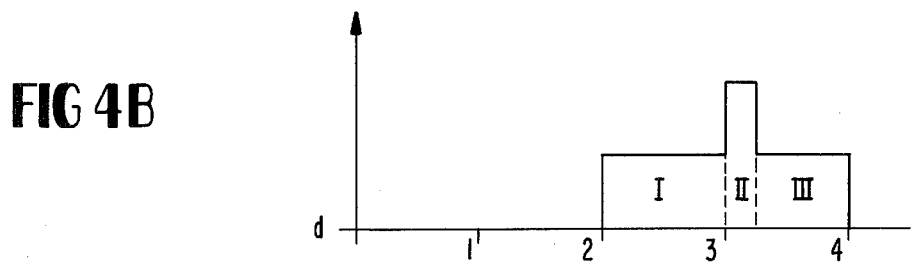

FIG. 4B illustrates the pulse sequence corresponding to example (d) of FIG. 3 wherein the second pulse is provided to maintain bubble integrity during magnetization reversal. Of course, it should be apparent that the last pulse in the sequence, pulse III, will not be present in a non-switching case.

Although the switch disclosed as exemplary herein employs current to maintain the bubble in the minor loop, and exhibits switching action in the absence of a switching current, those skilled in the art will readily appreciate that by varying the relative sizes and spaces in the propagation pattern, the reverse can be achieved, wherein switching current is employed to expel the bubble from the minor loop, and the absence of switching current maintains the bubble in the minor loop.

While the method and apparatus of the invention has been disclosed relative to a particular Y bar switch, those skilled in the art will appreciate that the magnetization reversal problem which is overcome by the method and apparatus disclosed herein will be exhibited in bubble devices other than the particular Y bar switch disclosed herein. More particularly, any SLM bubble device which includes a conductor crossing a permeable magnetic element will be subjected to bubble collapse during magnetization reversal when the bubble resides in the vicinity of the conductor. As disclosed herein, the bubble collapse can be avoided by a suitable localized magnetic field which can be produced, for example, by a current pulse in the conductor at the time of magnetization reversal. This current pulse can be of either polarity, although one polarity may require a higher amplitude than the other, as determined by device geometry. Furthermore, the amplitude of the current pulse required to prevent bubble collapse will be on the same order of magnitude as the current pulse required for bubble switching. On the other hand, aspects of the invention are useful regardless of device fabrication and so the scope of the invention is not to be restricted to the disclosed examples, but is to be determined from the attached claims.

What is claimed is:

1. Apparatus for operating a field access SLM bubble switch in which presence or absence of a current pulse in a conductor crossing a bubble propagation path determines a path for a bubble from more than one available path, said apparatus including:
bias and reorienting drive field sources for creating a time displaced series of potential wells,
a current source coupled to said conductor, and
control means for controlling said current source to produce a current pulse for creating a localized magnetic field to support a bubble in the vicinity of said conductor and for controlling said current source for producing a further current pulse to determine a path of travel for said bubble.

2. The apparatus of claim 1 in which said drive field is a rotating field and said current pulse is produced when a bubble is near said conductor and said drive field produces magnetization reversal in said conductor.

3. The apparatus of claim 1 in which said current pulse is opposite in polarity to said further current pulse.

4. The apparatus of claim 1 in which said current pulse supplies a potential well to support a bubble during magnetization reversal in said conductor.

5. The apparatus of claim 1 wherein said current pulse is opposite in polarity to said further current pulse and of the same order of magnitude as said current pulse.

6. The apparatus of claim 5 wherein said current pulse is present for about 18/360 of a cycle of said drive field.

7. The apparatus of claim 1 in which said further current pulse is of the same polarity as said current pulse.

8. The apparatus of claim 1 in which said current pulse is of the same polarity as said further current pulse and larger in amplitude by about 50%.

9. Apparatus for increasing operating margins of a field access bubble device including a conductor and a propagation path in which a current pulse in said conductor aids a function of said bubble device, said apparatus comprising:
bias and reorienting drive field sources for creating a time displaced series of potential wells,
a current source coupled to said conductor,
control means for controlling said current source to produce said current pulse for aiding said function of said bubble device and at least one further current pulse for creating a localized magnetic field for increasing operating margins of said device.

10. The apparatus of claim 9 in which said further current pulse increases lower field operating margin.

11. The apparatus of claim 10 in which said localized magnetic field inhibits bubble stripout.

12. The apparatus of claim 11 in which said bubble device is a bubble switch and said current pulse determines which of at least two available propagation paths a bubble will follow.

13. The apparatus of claim 9 which is a SLM bubble device and said further current pulse increases upper field margins of said device.

14. The apparatus of claim 13 in which said further current pulse supports a bubble near said conductor during magnetization reversal.

15. The apparatus of claim 14 in which said SLM bubble device is a bubble switch.

16. The apparatus of claim 9 in which said bias and reorienting drive fields support bubbles of a diameter on the order of one micron or less and said conductor has a width on the order of two microns or less.

17. In a SLM field access bubble device including a propagation path along which bubbles are propagated in one direction in response to a bias and reorienting drive field, a conductor crossing said propagation path, a current source connected to said conductor, and control means operating said current source for producing a current pulse in timed relation to said reorienting drive field for aiding in a function of said device and for producing a further current pulse for displacing a bubble in the vicinity of said conductor in a direction opposite to said one direction.

18. The apparatus of claim 17 in which said current pulse increases upper field operating margins of said device by supporting bubbles near said conductor during magnetization reversal in said conductor.

19. In a field access bubble device including a conductor which carries a current pulse to aid a function of said device a method of operating said device to increase operating margins thereof including the steps of:
selectively energizing said conductor with a first current pulse to aid in said device function, and
providing a time and space limited magnetic field in addition to bias and drive fields to increase said operating margins.

20. The method of claim 19 in which said time and space limited magnetic field is provided by energizing said conductor with at least a second current pulse.

21. The method of claim 19 in which said time and space limited magnetic field inhibits bubble stripout and thereby lowers operating margins of said devices.

22. The method of claim 19 in which said time and space limited magnetic field inhibits bubble collapse near said conductor and thereby raises operating margins of said device.

23. The method of claim 19 in which said device supports bubbles on the order of one micron or less in diameter and in which said conductor has a width of two microns or less.

24. The method of claim 19 in which said time and space limited magnetic field inhibits bubble stripout at one time and, at a later time inhibits bubble collapse near said conductor.

25. In a field access bubble switch including a propagation path along which bubbles are propagated in response to a bias and reorienting drive fields, a conductor crossing said propagation path, a current source connected to said conductor and control means operating said current source for producing a current pulse in timed relation to said reorienting drive field for displacing bubbles from a propagation path bubbles would travel in the absence of said pulse to a different propagation path, the improvement comprising means for modifying said current pulse in said control means to increase operating margins of said switch.

26. The apparatus of claim 25 in which said means for modifying alters the time duration of said pulse.

27. The apparatus of claim 25 in which said means for modifying alters the polarity of said pulse.

28. The apparatus of claim 25 in which said means for modifying alters the amplitude of said pulse.

* * * * *